(12) United States Patent
Shiibayashi

(10) Patent No.: US 10,650,771 B2
(45) Date of Patent: May 12, 2020

(54) OUTPUT AMPLIFIER AND DISPLAY DRIVER

(71) Applicant: LAPIS Semiconductor Co., Ltd., Yokohama (JP)

(72) Inventor: Kenichi Shiibayashi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/027,233

(22) Filed: Jul. 3, 2018

(65) Prior Publication Data

US 2019/0012980 A1 Jan. 10, 2019

(30) Foreign Application Priority Data

Jul. 6, 2017 (JP) .................. 2017-132765

(51) Int. Cl.
*G09G 3/36* (2006.01)
*H03F 3/45* (2006.01)

(52) U.S. Cl.
CPC ......... *G09G 3/3696* (2013.01); *G09G 3/3688* (2013.01); *H03F 3/45179* (2013.01); *H03F 3/45219* (2013.01); *G09G 2310/0291* (2013.01); *G09G 2320/0204* (2013.01); *G09G 2320/0233* (2013.01); *H03F 2200/129* (2013.01); *H03F 2203/45116* (2013.01)

(58) Field of Classification Search
None
See application file for complete search history.

(56) References Cited

U.S. PATENT DOCUMENTS 9,979,363 B2 * 5/2018 Ko ..................... H03F 3/45273

FOREIGN PATENT DOCUMENTS

JP 2012-088512 A 5/2012

\* cited by examiner

*Primary Examiner* — Kenneth B Lee, Jr.
(74) *Attorney, Agent, or Firm* — Rabin & Berdo, P.C.

(57) ABSTRACT

Provided is an output amplifier including a differential unit which sends a current corresponding to a voltage difference between a gradation voltage and an amplified gradation voltage to a first current line; a current mirror unit which sends an amount of current corresponding to the current flowing through the first current line, to a second current line; and an output unit including a first and a second drive line, an output line through which the amplified gradation voltage is output, a first output transistor which sends a current based on a voltage of the first drive line, and a second output transistor which sends a current based on a voltage of the second drive line. The output unit includes a voltage regulation circuit which controls the voltage of the first drive line being higher than the voltage of the second drive line.

7 Claims, 9 Drawing Sheets

OUTPUT AMPLIFIER AND DISPLAY DRIVER

BACKGROUND OF THE INVENTION

1. Field of the Invention

The present invention relates to an output amplifier that amplifies a gradation voltage based on a video signal, and a display driver including the output amplifiers.

2. Description of the Related Art

In display apparatus including display panels such as liquid crystal panels, display drivers which are configured to drive the display apparatus apply voltages in accordance with gradation levels of image data to the display panels in order to display images thereon. At this time, for the purpose of preventing degradation in the characteristics of liquid crystal materials, an inversion driving method is generally used in which the voltages to be applied to the liquid crystal are inverted at constant intervals. The display driver adopting the inversion driving method has, for example, a positive output amplifier and a negative output amplifier, and applies the gradation voltages to source lines while switching polarity between a positive pole and a negative pole.

Each of the positive output amplifier and the negative output amplifier is constituted of, for example, a differential stage, a current mirror stage, and an output stage. The output stage has a P-channel MOS transistor (hereinafter referred to as a P-channel transistor) and an N-channel MOS transistor (hereinafter referred to as an N-channel transistor) connected in series.

In such a display driver, in a switch-off period between a positive output period and a negative output period, variations occur in the voltage of a positive output terminal and the voltage of a negative output terminal. Thus, there occurs overshoot or undershoot in the waveform of an output voltage. In order to prevent the occurrence of the overshoot and the undershoot in the voltage waveform in the polarity switching, a display driver is proposed which includes a positive output fixing unit configured to fix the voltage of the positive output terminal and a negative output fixing unit configured to fix the voltage of the negative output terminal in the switch-off period (for example, Japanese Patent Application Laid-Open No. 2012-88512).

SUMMARY OF THE INVENTION

In a display driver configured to drive a display device having an n (n is an integer of 2 or more) number of source lines, when a rising operation is concurrently performed on n channels (i.e. all channels), overshoots and undershoots occur in voltage waveforms, just as in the case of the polarity switching.

For example, in a positive output amplifier, upon performing the rising operation on all the channels, a power voltage VDD drops (i.e., temporarily drops) owing to a charge current to a panel and a resistance of a power supply wiring. The drop of the power voltage VDD causes a reduction in a gate-source voltage Vgs of a P-channel transistor in an output stage, thus resulting in deterioration of drivability.

A gate potential of the P-channel transistor continues to fall until an output of the positive output amplifier reaches a target potential, owing to a discharge current to an N-channel side of a current mirror stage. Therefore, when the output of the positive output amplifier reaches the target potential, the gate potential of the P-channel transistor has fallen too much. The P-channel transistor is turned on from this state until the time when the gate potential of the P-channel transistor returns to a predetermined level. Therefore, an output waveform of the positive output amplifier overshoots its target potential.

On the other hand, in a negative output amplifier, a gate potential of an N-channel transistor continues to rise owing to a charge current from a P-channel side of a current mirror stage. Therefore, when an output of the negative output amplifier reaches a target potential, the gate potential of the N-channel transistor has risen too much. The N-channel transistor is turned on from this state until the time when the gate potential of the N-channel transistor returns to a predetermined level. Therefore, an output waveform of the negative output amplifier undershoots its target potential.

There is a problem that the overshoot and the undershoot cause degradation in image quality of the display device. There is also a problem that in a case where the waveform of the overshoot or the undershoot does not converge within 1 H (a horizontal period), or there is a difference in the overshoot or the undershoot between chips, brightness unevenness occurs.

As a method for compensating for deterioration in the drivability of each transistor in the output stage due to the drop of the power voltage VDD, it is conceivable to increase a gate width of each transistor. However, this method causes an increased chip size. There is also a problem that increased wiring and an increased parasitic capacity of each transistor cause an increase in parasitic capacities of internal nodes in the output stage, thus resulting in deterioration in characteristics, such as an increased delay time of the output waveform and worse heat generation.

In view of the above-described problems, the present invention has an object of providing an output amplifier that can effectively reduce a distortion of an output waveform at the time of rising of a display driver, and the display driver including the output amplifiers.

An output amplifier according to the present invention is configured to amplify a gradation voltage supplied thereto, so as to generate an amplified gradation voltage. The output amplifier includes a differential unit configured to send a current corresponding to a voltage difference between the gradation voltage and the amplified gradation voltage to a first current line; a current mirror unit connected between a first voltage supply line to which a first voltage is supplied and a second voltage supply line to which a second voltage lower than the first voltage is supplied, the current mirror unit being configured to send a current to the second current line by an amount corresponding to an amount of the current flowing through the first current line; and an output unit including first and second drive lines that are respectively connected to the second current line, an output line through which the amplified gradation voltage is output, a first output transistor configured to send a current based on a voltage of the first drive line to the output line, and a second output transistor configured to send a current based on a voltage of the second drive line to the output line. The output unit includes a voltage regulation circuit configured to control the voltage of the first drive line being higher than the voltage of the second drive line.

A display driver according to the present invention has a plurality of output amplifiers configured to amplify gradation voltages supplied there to, so as to generate amplified gradation voltages. The plurality of output amplifiers are constituted of a first output amplifier group and a second output amplifier group. Each of the output amplifiers belonging to the first output amplifier group and the second output amplifier group includes a differential unit configured to send a current corresponding to a voltage difference between the gradation voltage and the amplified gradation voltage to a first current line; a current mirror unit connected between a first voltage supply line to which a first voltage is supplied and a second voltage supply line to which a second voltage lower than the first voltage is supplied, the current mirror unit being configured to send a current to the second current line by an amount corresponding to an amount of the current flowing through the first current line; and an output unit including first and second drive lines respectively connected to the second current line, an output line through which the amplified gradation voltage is output, a first output transistor configured to send a current based on a voltage of the first drive line to the output line, and a second output transistor configured to send a current based on a voltage of the second drive line to the output line. The output unit of each of the output amplifiers belonging to the first output amplifier group includes a first voltage regulation circuit configured to control the voltage of the first drive line such that the voltage of the first drive line is higher than the voltage of the second drive line. The output unit of each of the output amplifiers belonging to the second output amplifier group includes a second voltage regulation circuit configured to control the voltage of the second drive line such that the voltage of the second drive line is lower than the voltage of the first drive line.

According to the output amplifier of the present invention, it is possible to effectively reduce a distortion of an output waveform at the time of rising of the display driver.

BRIEF DESCRIPTION OF THE DRAWINGS

The characteristics of the present invention will be described below with reference to the following accompanying drawings.

DETAILED DESCRIPTION OF THE INVENTION

Figure 1:
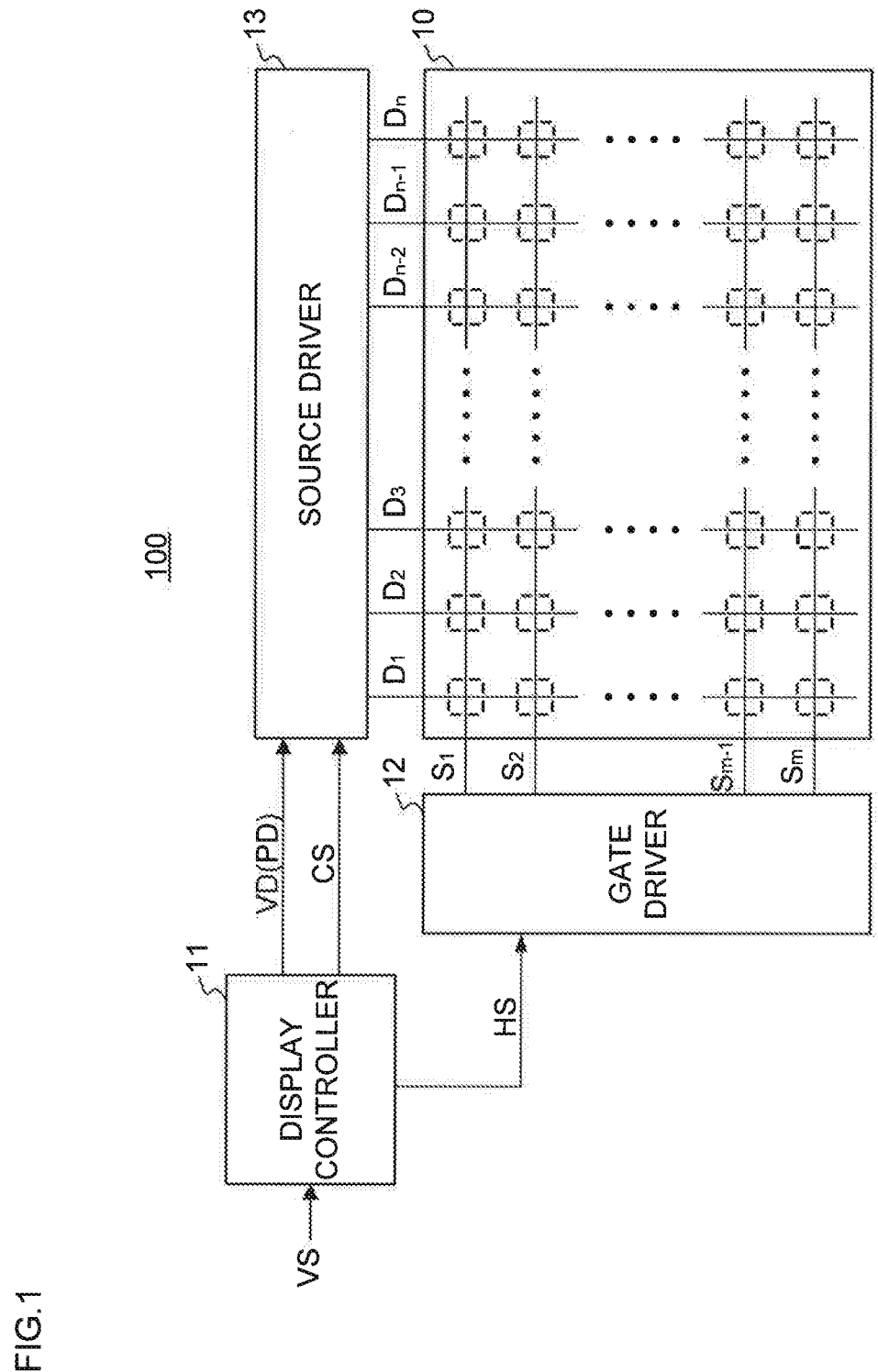
FIG. 1 is a block diagram showing a configuration of a display apparatus according to an embodiment.

An embodiment of the present invention will be described below with reference to the drawings. In the following description and accompanying drawings of the embodiment, the same reference numerals indicate the substantially same or equivalent components.

FIG. 1 is a block diagram showing a schematic configuration of a display apparatus 100 including output amplifiers according to the embodiment. The display apparatus 100 is a liquid crystal display apparatus that drives a display device 10 composed of, for example, a liquid crystal display or the like, by an inversion driving method. The display apparatus 100 includes the display device 10, a display controller 11, a gate driver 12, and a source driver 13.

In the display device 10, an m (m is an integer of 2 or more) number of horizontal scan lines $S_1$ to $S_m$ extending in a horizontal direction of a two-dimensional screen, and an n (n is an integer of 2 or more) number of data lines $D_1$ to $D_n$ extending in a vertical direction of the two-dimensional screen are formed. At intersections of the horizontal scan lines and the data lines, display cells (shown by broken lines in FIG. 1) serving as pixels are arranged into a matrix.

The display controller 11 supplies a video data signal VD that includes a series of pixel data PD indicating a brightness level of each pixel, on the basis of an input video signal VS, to the source driver 13. The display controller 11 detects a horizontal synchronization signal HS from the input video signal VS, and supplies the horizontal synchronization signal HS to the gate driver 12. The display controller 11 also supplies a switching control signal CS, which controls polarity inversion in the inversion driving, to the source driver 13.

The gate driver 12 generates a scan signal in synchronization with the horizontal synchronization signal HS supplied from the display controller 11, and sequentially supplies the scan signal to the horizontal scan lines $S_1$ to $S_m$ of the display device 10.

The source driver 13 generates an n number of pixel driving voltages for each of the horizontal scan lines on the basis of the video data signal VD, and applies the pixel driving voltages to the data lines $D_1$ to $D_n$ of the display device 10. At this time, the source driver 13 applies the pixel driving voltages to the data lines $D_1$ to $D_n$, while inverting the polarity of the pixel driving voltages.

Figure 2:
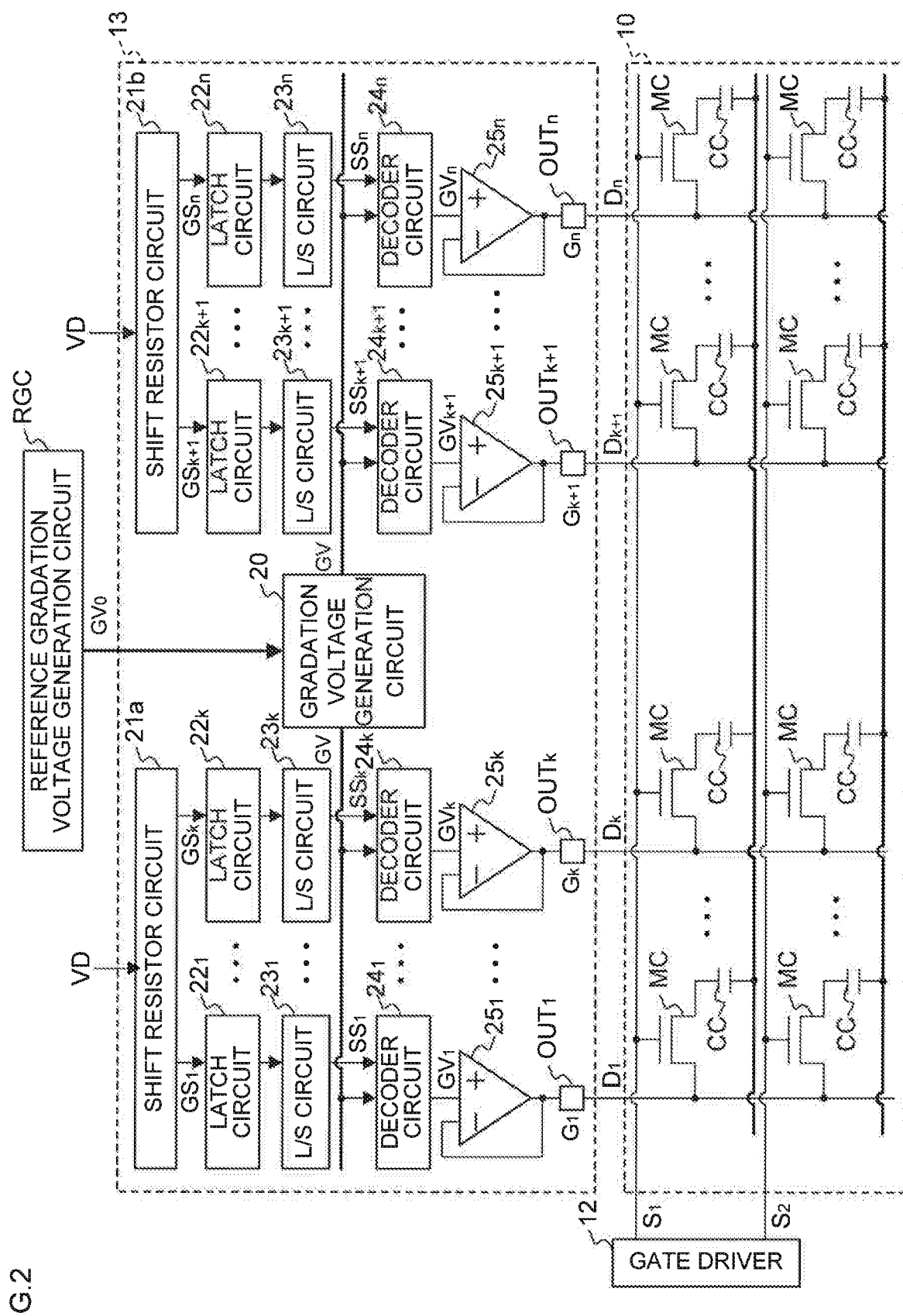
FIG. 2 is a block diagram showing a configuration of a source driver according to the embodiment.

FIG. 2 is a block diagram showing a configuration of the source driver 13 and a part of the display device 10. Each display cell of the display device 10 is constituted of a cell transistor MC and a capacitor CC. Note that FIG. 2 omits display cells for the horizontal scan lines $S_3$ or below (i.e. $S_3$ to $S_m$).

The source driver 13 has a gradation voltage generation circuit 20 and shift resistor circuits 21a and 21b. The source driver 13 also has latch circuits $22_1$ to $22_n$, L/S circuits $23_1$ to $23_n$, decoder circuits $24_1$ to $24_n$, output amplifiers $25_1$ to $25_n$, and output terminals OUT1 to OUTn, which correspond to the data lines $D_1$ to $D_n$, respectively.

The gradation voltage generation circuit 20 generates a p (p is an integer of 2 or more) number of gradation voltages GV indicating p levels of gradation on the basis of a reference gradation voltage $GV_0$ supplied from, for example, an external reference gradation voltage generation circuit RGC. The gradation voltage generation circuit 20 has, for example, a ladder resistor (not shown) having a plurality of resistances connected in series, and generates the p number of gradation voltages GV by taking out a voltage divided by each resistance of the ladder resistor. The reference gradation voltage generation circuit RGC, the gate driver 12, and the source driver 13 are formed in different IC chips.

The shift resistor circuit 21a is provided for the first half data lines $D_1$ to $D_k$ (k is an integer of 1<k<n, for example, when n is an even number, k=½n) of the data lines $D_1$ to $D_n$. The shift resistor circuit 21a receives the video data signal VD, and generates gradation signals $GS_1$ to $GS_k$. Each of the gradation signals $GS_1$ to $GS_k$ is, for example, an 8-bit digital signal indicating the brightness level of each display cell of the display device 10.

In the same manner, the shift resistor circuit 21b is provided for the latter half data lines $D_{k+1}$ to $D_n$ of the data lines $D_1$ to $D_n$. The shift resistor circuit 21b receives the video data signal VD, and generates gradation signals $GS_{k+1}$ to $GS_n$.

The latch circuits $22_1$ to $22_n$ capture the gradation signals $GS_1$ to $GS_n$ on the basis of an inputted latch signal (not shown), and supply the gradation signals $GS_1$ to $GS_n$ to the individual L/S circuits $23_1$ to $23_n$, respectively, in a synchronous manner.

The L/S circuits $23_1$ to $23_n$ are level shift circuits that shift the levels of the gradation signals $GS_1$ to $GS_n$ by a predetermined level. The L/S circuits $23_1$ to $23_n$ supply the gradation signals $SS_1$ to $SS_n$, which are obtained by the level shift, to the decoder circuits $24_1$ to $24_n$.

The decoder circuits $24_1$ to $24_n$ select voltages corresponding to an n number of display data from among the p number of gradation voltages GV supplied from the gradation voltage generation circuit 20 on the basis of the gradation signals $SS_1$ to $SS_n$ supplied from the L/S circuits $23_1$ to $23_n$, and supply the selected voltages to the output amplifiers $25_1$ to $25_n$ as gradation voltages $GV_1$ to $GV_n$, respectively.

The output amplifiers $25_1$ to $25_n$ amplify the gradation voltages $GV_1$ to $GV_n$, and output the gradation voltages $GV_1$ to $GV_n$ to the output terminals OUT1 to OUTn as pixel driving voltages $G_1$ to $G_n$. The outputted pixel driving voltages $G_1$ to $G_n$ are supplied to the data lines $D_1$ to $D_n$, respectively.

The output amplifiers $25_1$ to $25_n$ include positive output amplifiers and negative output amplifiers. For example, the odd-numbered output amplifiers of the output amplifiers $25_1$ to $25_n$ may be configured as positive output amplifiers, while the even-numbered output amplifiers may be configured as negative output amplifiers.

Figure 3:
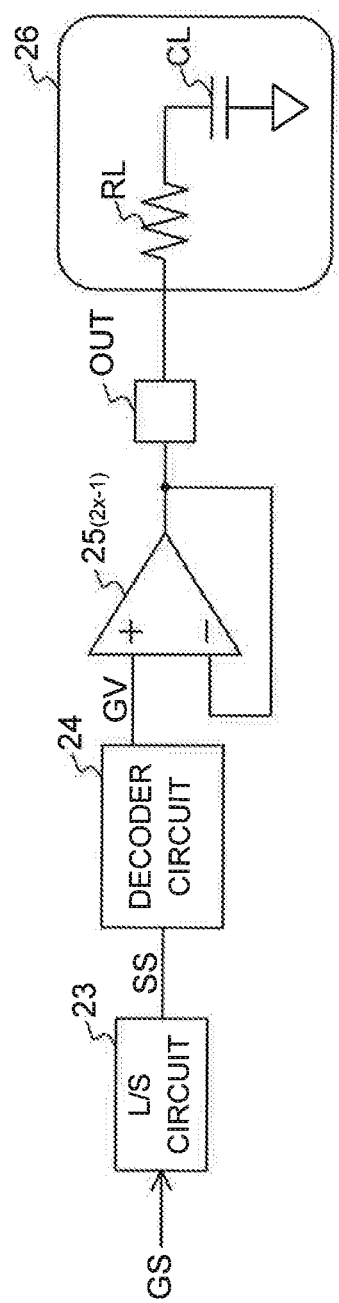
FIG. 3 is a block diagram showing a configuration of an output amplifier and former and later stages thereof according to the embodiment.

FIG. 3 is a block diagram showing a configuration of a positive output amplifier, which is included in the output amplifiers $25_1$ to $25_n$, and former and later stages thereof. In the drawing, an L/S circuit 23, a decoder circuit 24, and an output terminal OUT represent an L/S circuit, a decoder circuit, and an output terminal for a positive output amplifier $25_{(2x-1)}$, respectively. A data line load 26 is connected to the output terminal OUT.

The data line load 26 is a data line load (simplified equivalent model) of a display panel, and includes a wiring resistance RL and a wiring capacitance CL. The data line load 26 is connected to the positive output amplifier $25_{(2x-1)}$ through the output terminal OUT.

Figure 4:
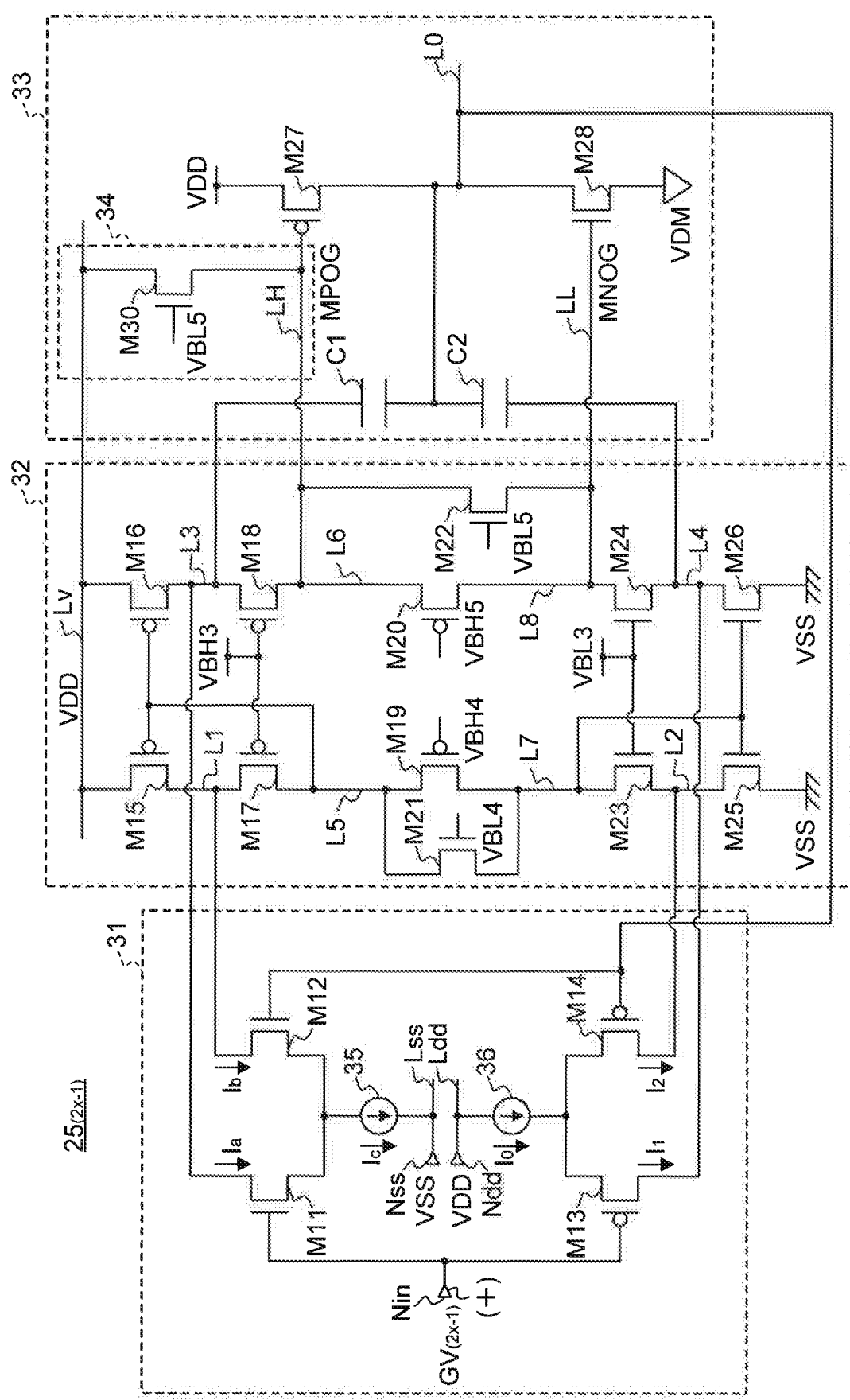
FIG. 4 is a circuit diagram showing a configuration of a positive output amplifier according to the embodiment.

FIG. 4 is a circuit diagram showing an internal configuration of the positive output amplifier $25_{2x-1}$ according to the embodiment. The positive output amplifier $25_{(2x-1)}$ includes a differential input unit 31, a current mirror unit 32, and an output unit 33.

The differential input unit 31 includes transistors M11 and M12 that are N-channel (second conductive type) MOSFETs (metal oxide semiconductor field effect transistors), transistors M13 and M14 that are P-channel (first conductive type) MOSFETs, and current sources 35 and 36. To the differential input unit 31, a positive gradation voltage $GV_{(2x-1)}$ (an odd-numbered gradation voltage of $GV_1$ to $GV_n$) is supplied.

One end of the current source 35 is connected to a ground line Lss to which a ground potential VSS is applied. The other end of the current source 35 is connected to sources of the transistors M11 and M12. The current source 35 generates a constant current Ic, and supplies the ground line Lss with the constant current Ic.

The gradation voltage $GV_{(2x-1)}$ is supplied to a gate of the transistor M11 from the decoder circuit 24 through an input terminal Nin. The transistor M11 has a drain connected to a line L3 of the current mirror unit 32. A current Ia from the line L3 flows through the drain and a source of the transistor M11, and is supplied to the current source 35.

The transistor M12 has a gate connected to an output line L0. The transistor M12 has a drain connected to a line L1 of the current mirror unit 32. A current Ib from the line L1 flows through the drain and a source of the transistor M12, and is supplied to the current source 35. The current value of the sum of the currents Ia and Ib is equal to the current value of the current Ic.

One end of the current source 36 is connected to a power line Ldd to which a power potential VDD is applied. The other end of the current source 36 is connected to sources of the transistors M13 and M14. The current source 36 generates a constant current $I_0$ on the basis of the power potential VDD, and divides the constant current $I_0$ so as to supply the divided currents to sources of the transistors M13 and M14.

The gradation voltage $GV_{(2x-1)}$ is supplied to a gate of the transistor M13 from the decoder circuit 24 through the input terminal Nin. The transistor M13 has a drain connected to a line L4 of the current mirror unit 32. The transistor M13 supplies the line L4 with a current $I_1$ in accordance with the gradation voltage $GV_{(2x-1)}$ supplied to the gate thereof.

The transistor M14 has a gate connected to the output line L0. The transistor M14 has a drain connected to a line L2 of the current mirror unit 32. The transistor M14 supplies the line L2 with a current $I_2$ in accordance with the voltage of the output line L0. The current value of the sum of the currents $I_1$ and $I_2$ is equal to the current value of the current $I_0$.

The current mirror unit 32 includes transistors M15 to M20 that are P-channel MOSFETs, and transistors M21 to M26 that are N-channel MOSFETs. The current mirror unit 32 has a first current line including lines L1, L5, L7, and L2, and a second current line including lines L3, L6, L8 and L4. The current mirror unit 32 makes a current flow through the second current line by an amount corresponding to the amount of a current flowing through the first current line.

The transistors M15 and M16 are connected to a power line Lv, to which the power potential VDD is applied, at their sources. The transistors M15 and M16 are connected to each other at their gates. The transistor M15 has a drain connected to the line L1. The transistor M16 has a drain connected to the line L3.

The transistor M17 has a source connected to the line L1 and the drain of the transistor M15. The transistor M18 has a source connected to the line L3 and the drain of the transistor M16. The transistors M17 and M18 are connected to each other at their gates, and a bias voltage VBH3 is supplied to the gates of the transistors M17 and M18. The transistor M17 has a drain connected to the line L5 and the gates of the transistors M15 and M16. The transistor M18 has a drain connected to the line L6 and a positive side drive line LH.

The transistors M15 to M18 compose a high voltage side current mirror circuit. Accordingly, a current of the same amount as a source-drain current of the transistor M15 and the transistor 17 flows through the source and the drain of the transistor M16 and the transistor 18.

The transistor M19 has a source connected to the line L5, and a drain connected to the line L7. A bias voltage VBH4 is supplied to a gate of the transistor M19.

The transistor M20 has a source connected to the line L6, and a drain connected to the line L8. A bias voltage VBH5 is supplied to a gate of the transistor M20. To the line L6, the positive side drive line LH is connected.

The transistor M21 has a source connected to the line L7, and a drain connected to the line L5. A bias voltage VBL4 is supplied to a gate of the transistor M21.

The transistor M22 has a source connected to a negative side drive line LL, and a drain connected to the positive side drive line LH. A bias voltage VBL5 is supplied to a gate of the transistor M22.

The transistor M23 has a source connected to the line L2. The transistor M24 has a source connected to the line L4. The transistors M23 and M24 are connected to each other at their gates, and a bias voltage VBL3 is supplied to the gates of the transistors M23 and M24. The transistor M23 has a drain connected to the line L7. The transistor M24 has a drain connected to the line L8 and the negative side drive line LL.

The ground potential VSS is applied to sources of the transistors M25 and M26. The transistors M25 and M26 are connected to each other at their gates. The transistor M25 has a drain connected to the line L2 and the source of the transistor M23. The transistor M26 has a drain connected to the line L4 and the source of the transistor M24.

According to this configuration, a positive drive voltage MPOG is generated, and supplied to the output unit 33 through the positive side drive line LH. A negative drive voltage MNOG is generated, and supplied to the output unit 33 through the negative side drive line LL.

The output unit 33 includes a transistor M27 that is a P-channel MOSFET, a transistor M28 that is an N-channel MOSFET, and capacitors C1 and C2 for phase compensation. The output unit 33 also has a clamp circuit 34.

The transistor M27 has a source connected to the power line Lv, and a gate connected to the positive side drive line LH. The transistor M27 has a drain connected to the output line L0. The transistor M27 sends a current based on the positive drive voltage MPOG, which is the voltage of the positive side drive line LH, to the output line L0.

An intermediate potential VDM (for example, ½VDD) that is a middle potential between the power potential VDD and the ground potential VSS is applied to a source of the transistor M28. The transistor M28 has a gate connected to the negative side drive line LL. The transistor M28 has a drain connected to the output line L0 and the drain of the transistor M27. The transistor M28 sends a current based on the negative drive voltage MNOG, which is the voltage of the negative side drive line LL, to the output line L0.

The capacitor C1 is connected to the line L3 at one end, and is connected to the output line L0 at the other end. The capacitor C2 is connected to the line L4 at one end, and is connected to the other end of the capacitor C1 and the output line L0 at the other end.

Next, the clamp circuit 34, which is a characterized portion of the output amplifier according to the embodiment, will be described. The clamp circuit 34 includes a transistor M30 that is an N-channel MOSFET. The transistor M30 has a drain connected to the power line Lv, and a source connected to the positive side drive line LH. The bias voltage VBL5 is supplied to a gate of the transistor M30.

The bias voltage VBL5 is set at the voltage value of the sum of the negative drive voltage MNOG and a threshold voltage Vth of the transistor M30. For example, when the negative drive voltage MNOG is 12 V and the threshold voltage Vth of the transistor M30 is 2 V, the bias voltage VBL5 is set at 14 V.

The transistor M30 is turned on, when a gate-source voltage (VBL5-MPOG) exceeds the threshold voltage Vth. Accordingly, the positive side drive line LH is connected to the power line Lv. For example, in a case where the bias voltage VBL5 is 14 V and the threshold voltage Vth is 2 V, when the positive drive voltage MPOG is 12 V or less, the transistor M30 is turned on. Accordingly, the positive side drive line LH and the power line Lv are connected, so that the positive drive voltage MPOG rises to the power potential VDD. In other words, the clamp circuit 34 functions as a switching circuit to connect the positive side drive line LH and the power line Lv in accordance with the positive drive voltage MPOG, as well as functioning as a voltage regulation circuit that regulates that the positive drive voltage MPOG does not become equal to or lower than the negative drive voltage MNOG.

The output unit 33 generates a positive pixel driving voltage $G_{(2x-1)}$ (i.e., an amplified gradation voltage to which the gradation voltage $GV_{(2x-1)}$ has been amplified) having a voltage value corresponding to the positive gradation voltage $GV_{(2x-1)}$ on the basis of the positive drive voltage MPOG and the negative drive voltage MNOG, and outputs the positive pixel driving voltage $G_{(2x-1)}$ through the output line L0. In the following description, the pixel driving voltage outputted through the output line L0 is also referred to as an output voltage.

Next, the operation of the positive output amplifier $25_{(2x-1)}$ in a rising operation of the source driver 13 will be described. First, upon an increase in the voltage value of the gradation voltage $GV_{(2x-1)}$ inputted to the positive output amplifier $25_{(2x-1)}$ from a low voltage state (for example, intermediate potential VDM+0.2 V), i.e., a so-called rising of voltage, the transistor M11 is turned on, and the transistor M12 is turned off in the differential input unit 31. Accordingly, a current Ia (=Ic) flows from the line L3 through the transistor M11 into the current source 35. Also, the transistor M13 is turned off, and the transistor M14 is turned on. Accordingly, a current $I_2$ (=$I_0$) flows from the current source 36 through the transistor M14 into the line L2.

Accordingly, in the current mirror unit 32, a current flows through the lines L4 and L6. Thus, a current flows from the positive side drive line LH through the transistors M22, M24, and M26 into the line L4. Therefore, the potential of the positive drive voltage MPOG falls.

When the positive drive voltage MPOG falls to the negative drive voltage MNOG (for example, 12 V) or less, a gate-source voltage Vgs (bias voltage VBL5 (for example, 14 V)—positive drive voltage MPOG) of the transistor M30 exceeds Vth (for example, 2 V) which is a threshold voltage of the transistor M30, so that the transistor M30 is turned on. Thus, the positive side drive line LH is connected to the power line Lv, and the positive drive voltage MPOG is charged.

According to the operation described above, the positive drive voltage MPOG is prevented from falling to the negative drive voltage MNOG or less in the rising operation of the source driver 13. The voltage range of the positive drive voltage MPOG is thereby limited. For example, when the power potential VDD is 17 V, the negative drive voltage MNOG is 12 V, and the threshold voltage Vth2 of the transistor M27 is 1 V, the positive drive voltage MPOG is within the range of 12 V (=MNOG)<MPOG<16 V (=VDD−Vth2).

Since the positive drive voltage MPOG is prevented from falling, the positive drive voltage MPOG is returned to a predetermined voltage level (DC level) in a short time period. Therefore, it is possible to reduce an overshoot of an output voltage (i.e., positive pixel driving voltage $G_{(2x-1)}$) owing to the transistor M27 being kept turned on in the period.

Figure 5:
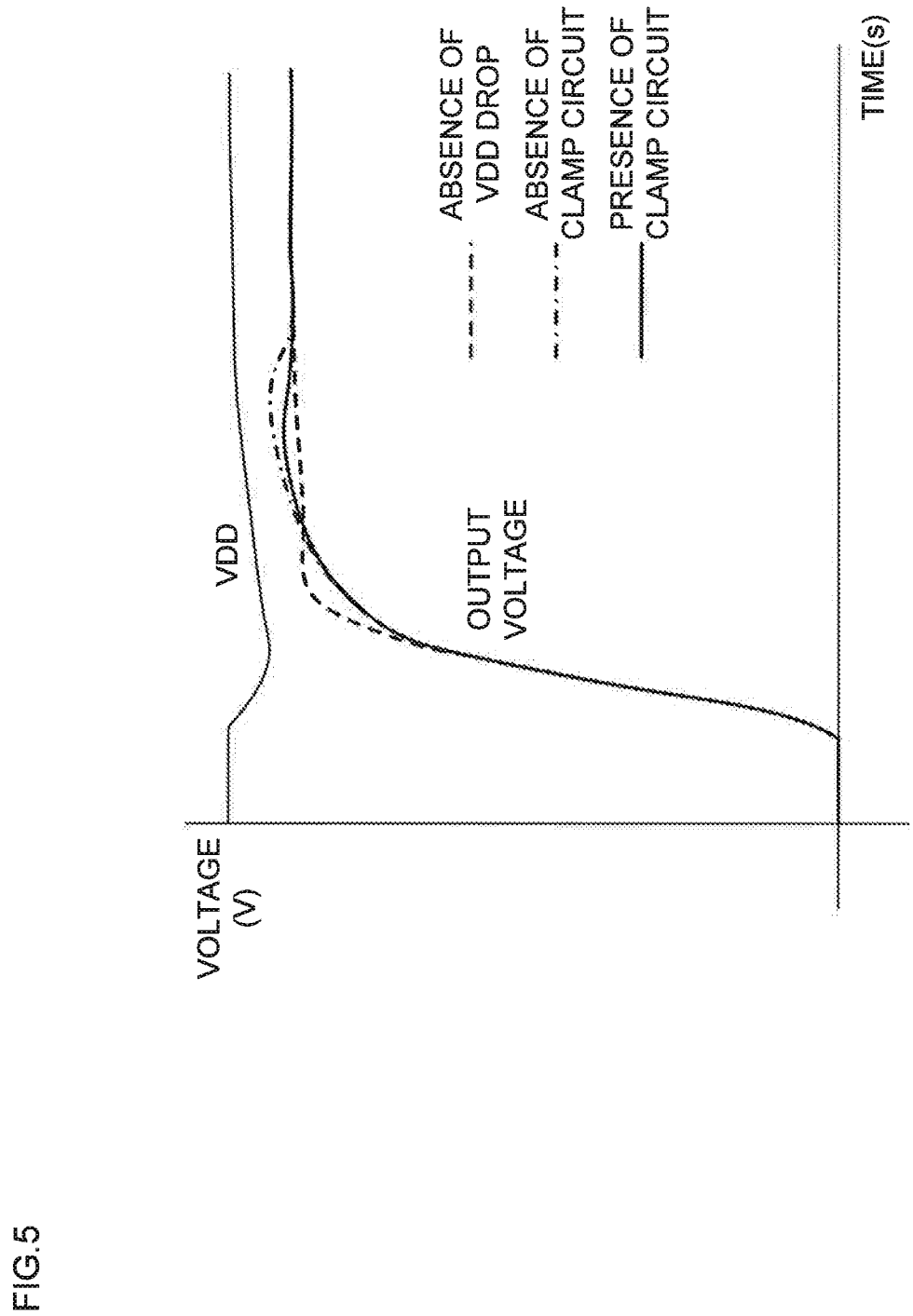
FIG. 5 is a graph showing an output waveform of the positive output amplifier according to the embodiment.
Figure 6:
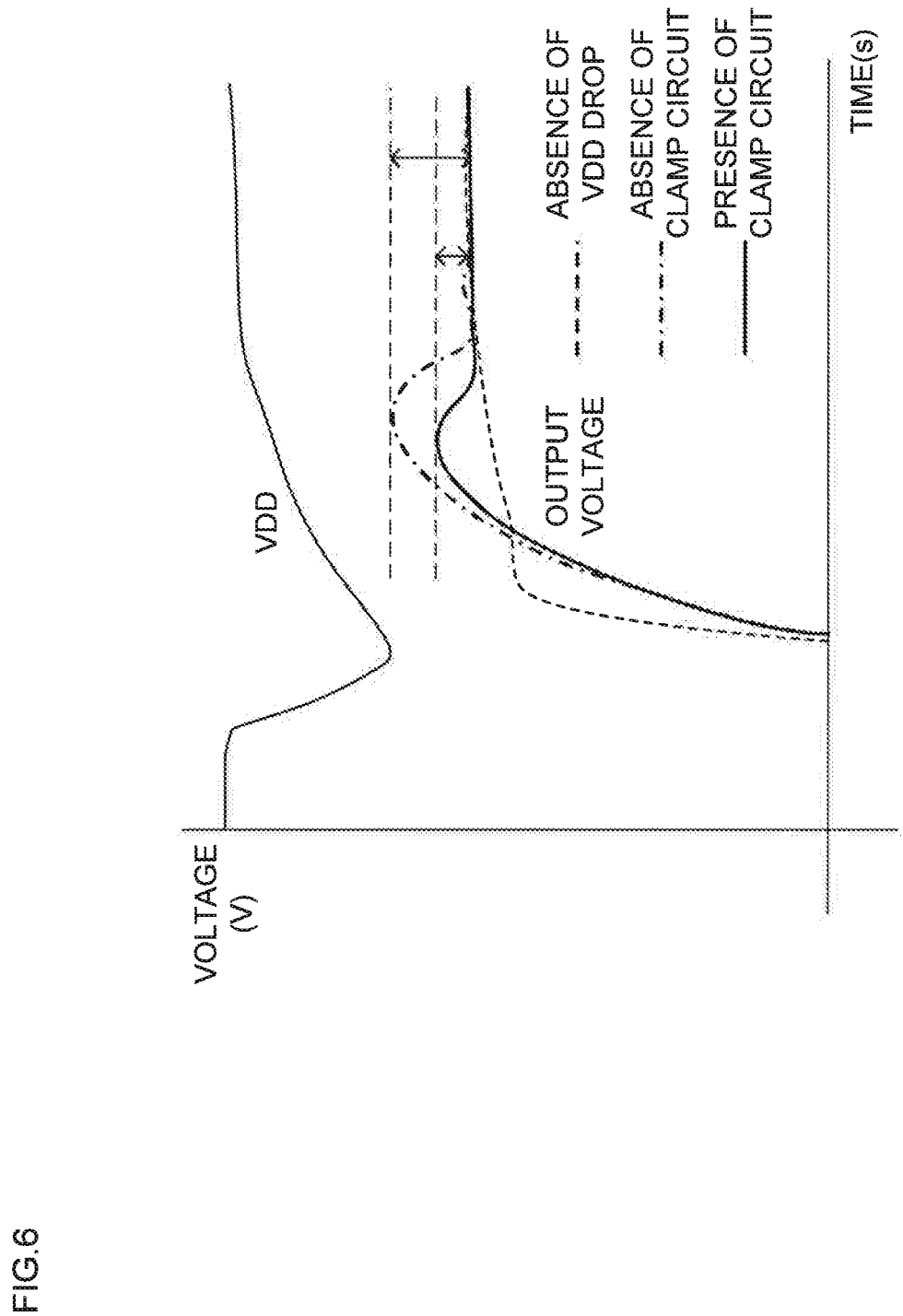
FIG. 6 is a graph showing the output waveform of the positive output amplifier according to the embodiment in a partly enlarged manner.

FIG. 5 is a graph showing waveforms of the power potential VDD and the output voltage (positive pixel driving voltage $G_{(2x-1)}$) in the rising operation, and FIG. 6 is a graph showing the waveforms in a partly enlarged manner. Each graph shows a waveform of the power potential VDD, a waveform of the output voltage without a reduction in the power potential VDD (broken line), a waveform of the output voltage without the clamp circuit 34 according to the embodiment (alternate long and short dashed lines), and a waveform of the output voltage in the embodiment having the clamp circuit 34. (solid line)

When the clamp circuit 34 is absent, the drivability of the P-channel transistor (corresponding to the transistor M27 of the embodiment) in the output stage deteriorates owing to a drop of the power potential VDD (a temporary voltage reduction). Thus, the potential of the positive drive voltage MPOG supplied to the gate of the P-channel transistor continues to fall owing to a discharge current on the N-channel side of the current mirror stage (corresponding to a lower portion of the current mirror unit 32 of the embodiment). Therefore, when the output of the positive output amplifier reaches a target potential, the gate potential of the P-channel transistor has fallen too much, and the P-channel transistor is kept in an on state until the gate potential returns to a predetermined level. Therefore, as shown by the alternate long and short dashed lines in FIGS. 5 and 6, the output waveform of the positive output amplifier overshoots its target potential.

However, since the positive output amplifier $25_{(2x-1)}$ of the embodiment has the above-described clamp circuit 34, when the positive drive voltage MPOG falls to the negative drive voltage MNOG or less, the transistor M30 is turned on. The positive side drive line LH is thereby connected to the power line Lv, and the positive drive voltage MPOG is charged. Therefore, the positive drive voltage MPOG is prevented from falling to the negative drive voltage MNOG or less, and as shown by the solid lines in FIGS. 5 and 6, the degree (voltage value) of an overshoot in the output waveform of the positive output amplifier is reduced.

The source driver 13 according to the embodiment has a configuration so as to prevent an undershoot in the output voltage in the negative output amplifier.

Figure 7:
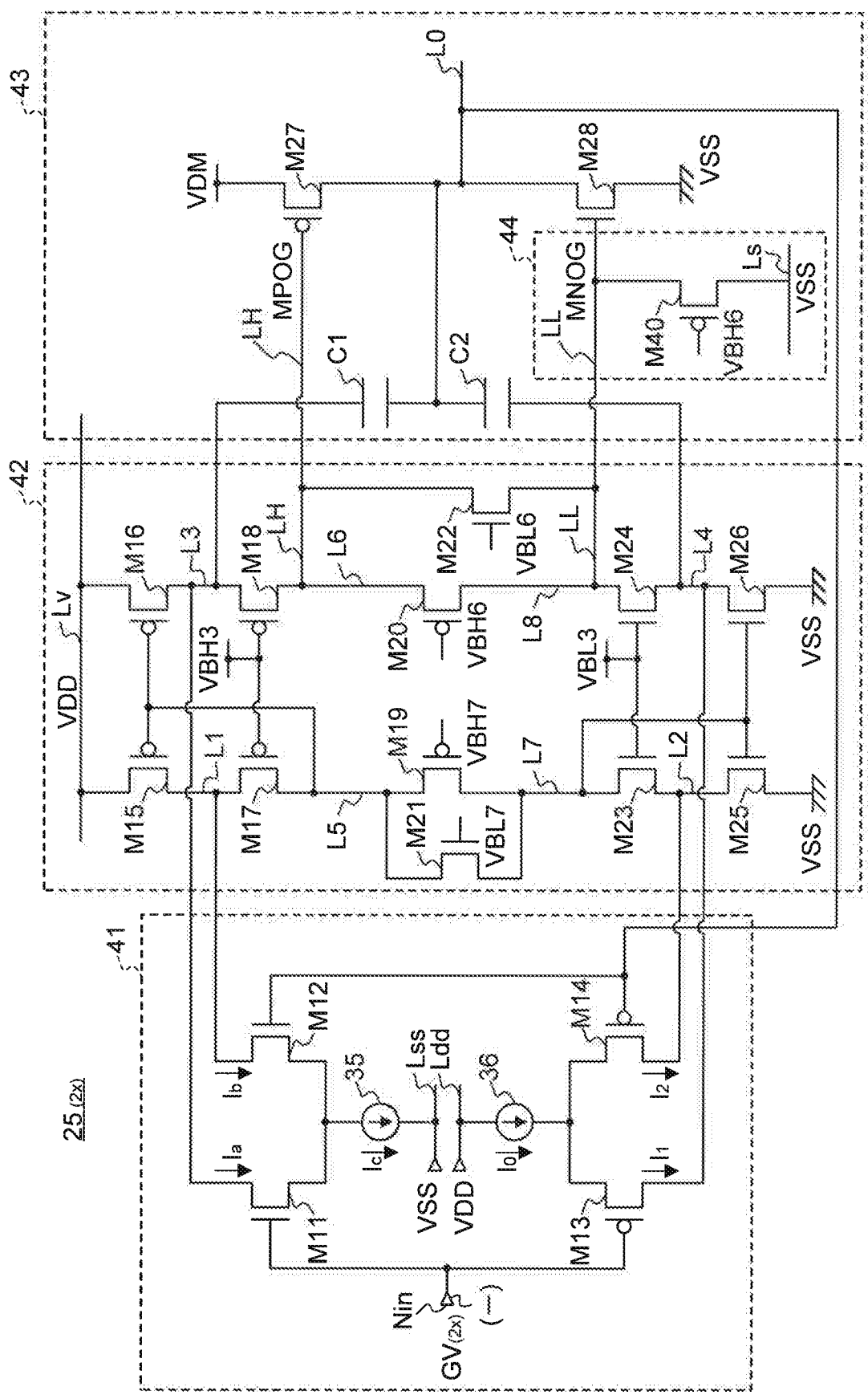
FIG. 7 is a circuit diagram showing a configuration of a negative output amplifier according to the embodiment.

FIG. 7 is a circuit diagram showing an internal configuration of a negative output amplifier $25_{(2x)}$ according to the embodiment. The negative output amplifier $25_{(2x)}$ has a differential input unit 41, a current mirror unit 42, and an output unit 43.

The differential input unit 41 has the same configuration as that of the differential input unit 31 of the positive output amplifier $25_{(2x-1)}$. A negative gradation voltage $GV_{(2x)}$ (i.e., an even-numbered gradation voltage of the gradation voltages $GV_1$ to $GV_n$) is supplied to a gate of each of transistors M11 and M13 of the differential input unit 41.

Just as with the current mirror unit 32 of the positive output amplifier $25_{(2x-1)}$, the current mirror unit 42 includes transistors M15 to M20 that are P-channel MOSFETs, and transistors M21 to M26 that are N-channel MOSFETs.

In the current mirror unit 42, as contrast to the current mirror unit 32, a bias voltage VBH6 is supplied to a gate of the transistor M20. A bias voltage VBL6 is supplied to a gate of the transistor M22. A bias voltage VBH7 is supplied to a gate of the transistor M19. A bias voltage VBL7 is supplied to a gate of the transistor M21.

The output unit 43 has a transistor M27 that is a P-channel MOSFET, a transistor M28 that is an N-channel MOSFET, and capacitors C1 and C2 for phase compensation. The output unit 43 also has a clamp circuit 44.

An intermediate potential VDM is applied to a source of the transistor M27. The transistor M27 has a gate connected to a positive side drive line LH, and a drain connected to an output line L0.

A ground potential VSS is applied to a source of the transistor M28. The transistor M28 has a gate connected to a negative side drive line LL, and a drain connected to the output line L0 and the drain of the transistor M27.

The clamp circuit 44, which is a characterized portion of the output amplifier according to the embodiment, includes a transistor M40 that is a P-channel MOSFET. The transistor M40 has a drain connected to a ground line Ls to which the ground potential VSS is applied, and a source connected to the negative side drive line LL. The bias voltage VBH6 is supplied to a gate of the transistor M40.

The bias voltage VBH6 is set at a voltage value that coincides with the difference between the positive drive voltage MPOG and a threshold voltage Vth of the transistor M40. For example, when the intermediate potential VDM is 8.5 V (=VDD/2), the positive drive voltage MPOG is 6 V, and the threshold voltage Vth of the transistor M40 is 2 V, the bias voltage VBH6 is set at 4 V.

The transistor M40 is turned on, when a gate-source voltage (VBH6-MNOG) exceeds the threshold voltage Vth. Accordingly, the negative side drive line LL is connected to the ground potential VSS. For example, in a case where the bias voltage VBH6 is 4 V and the threshold voltage Vth is 2 V, when the negative drive voltage MNOG is 6 V or more, the transistor M40 is turned on and the negative side drive line LL and the ground line Ls are connected, so that the negative drive voltage MNOG falls. In other words, the clamp circuit 44 functions as a switching circuit to connect the negative side drive line LL and the ground line Ls in accordance with the negative drive voltage MNOG, as well as functioning as a voltage regulation circuit that regulates that the negative drive voltage MNOG does not become equal to or higher than the positive drive voltage MPOG.

The output unit 43 generates a negative pixel driving voltage $G_{(2x)}$ (i.e., an amplified gradation voltage to which the gradation voltage $GV_{(2x)}$ has been amplified, hereinafter also referred to as an output voltage) having a voltage value corresponding to the negative gradation voltage $GV_{(2x)}$ on the basis of the positive drive voltage MPOG and the negative drive voltage MNOG, and outputs the negative pixel driving voltage $G_{(2x)}$ through the output line L0.

Next, the operation of the negative output amplifier $25_{(2x)}$ will be described. First, upon a decrease in the voltage value of the negative gradation voltage $GV_{(2x)}$ inputted to the negative output amplifier $25_{(2x)}$, i.e., a so-called falling of voltage, a current flows through the lines L6 and L8 of the current mirror unit 42. Therefore, the potential of the negative drive voltage MNOG rises.

When the negative drive voltage MNOG rises to the positive drive voltage MPOG (for example, 6 V) or more, a gate-source voltage Vgs (negative drive voltage MNOG-bias voltage VBH6 (for example, 4 V)) of the transistor M40 exceeds Vth (for example, 2 V), i.e. a threshold voltage of the transistor M40, so that the transistor M40 is turned on. Thus, the negative side drive line LL is connected to the ground line Ls, and the negative drive voltage MNOG is discharged.

According to the operation described above, the negative drive voltage MNOG is prevented from rising to the positive drive voltage MPOG or more. Since the negative drive voltage MNOG is prevented from rising, the negative drive voltage MNOG is returned to a predetermined voltage level (DC level) in a short time period. Therefore, it is possible to reduce an undershoot of an output voltage (i.e., negative pixel driving voltage $G_{(2x)}$) owing to the transistor M28 being kept turned on in the period.

Figure 8:
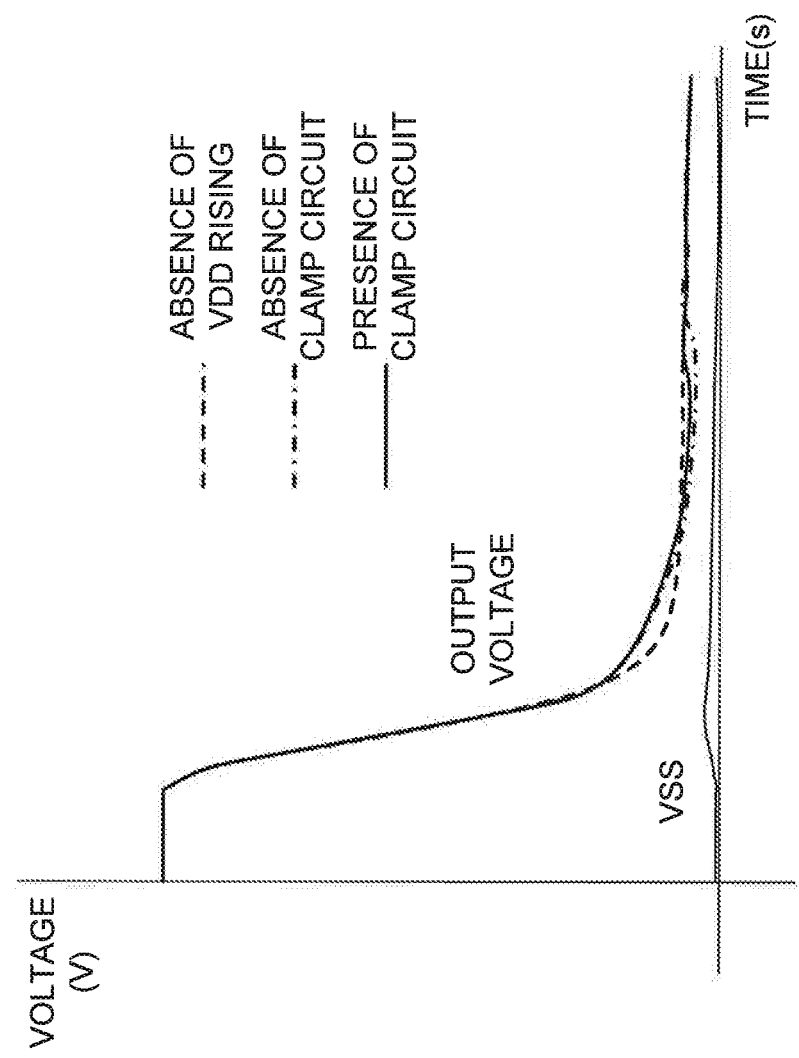
FIG. 8 is a graph showing an output waveform of the negative output amplifier according to the embodiment.
Figure 9:
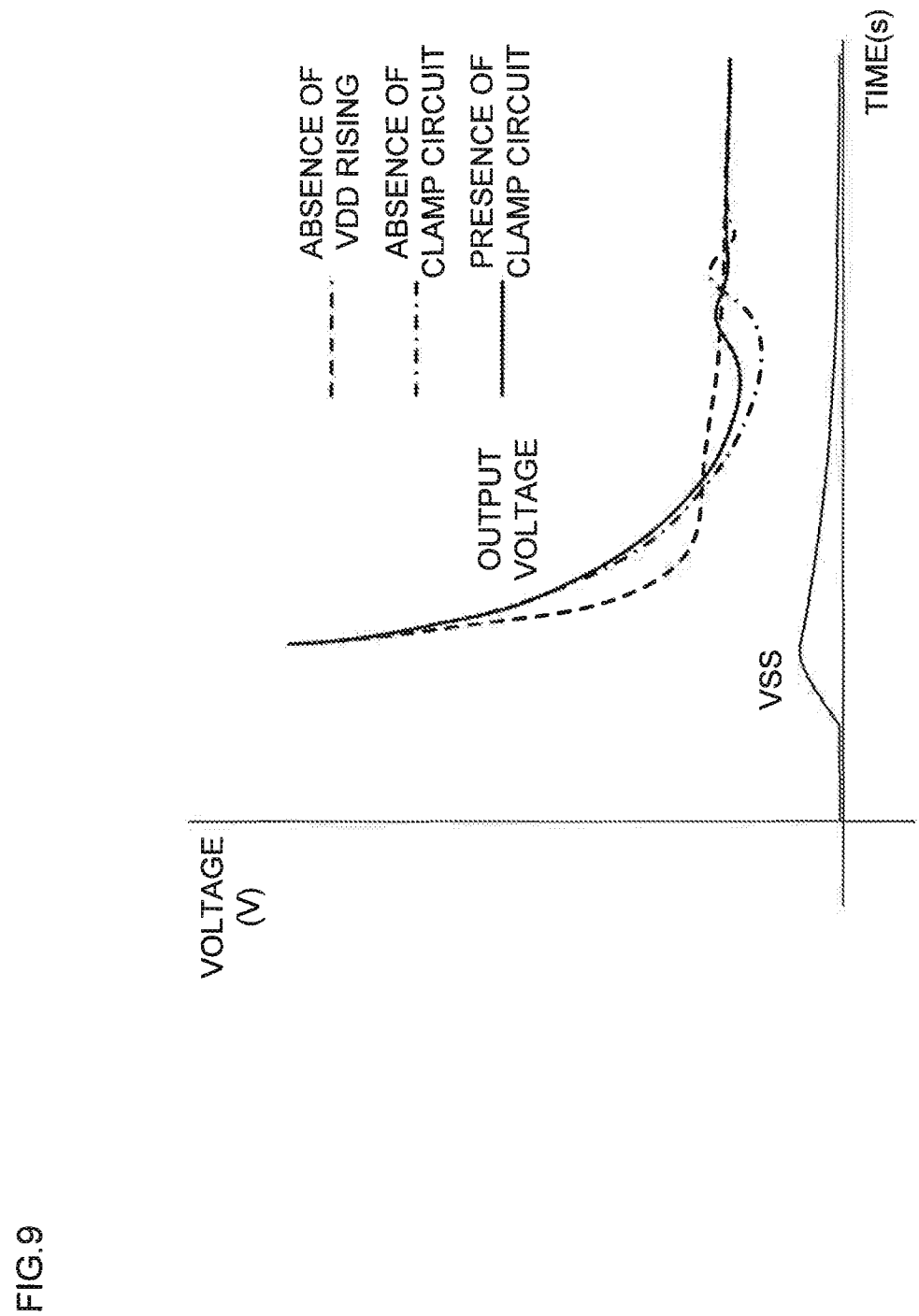
FIG. 9 is a graph showing the output waveform of the negative output amplifier according to the embodiment in a partly enlarged manner.

FIG. 8 is a graph showing waveforms of the ground potential VSS and the output voltage (negative pixel driving voltage $G_{(2x)}$) in the falling operation, and FIG. 9 is a graph showing the waveforms in a partly enlarged manner. Each graph shows a waveform of the ground potential VSS, a waveform of the output voltage without an increase in the ground potential VSS (broken line), a waveform of the output voltage without the clamp circuit 44 according to the embodiment (alternate long and short dashed lines), and a waveform of the output voltage in the embodiment having the clamp circuit 44 (solid line).

When the clamp circuit 44 is absent, the drivability of the N-channel transistor (corresponding to the transistor M28 of the embodiment) in the output stage deteriorates owing to a rising of the ground potential VSS (a temporary voltage increase). Thus, the potential of the negative drive voltage MNOG applied to the gate of the N-channel transistor continues to rise owing to a charge current on the P-channel side of the current mirror stage (corresponding to an upper portion of the current mirror unit 42 of the embodiment). Therefore, when the output of the negative output amplifier reaches a target potential, the gate potential of the N-channel transistor has risen too much, and the N-channel transistor is kept in an on state until the gate potential returns to a predetermined level. Therefore, as shown by the alternate long and short dashed lines in FIGS. 8 and 9, the output waveform of the negative output amplifier undershoots its target potential.

However, since the negative output amplifier 25$_{(2x)}$ of the embodiment has the above-described clamp circuit 44, when the negative drive voltage MNOG rises to the positive drive voltage MPOG or more, the transistor M40 is turned on. The negative side drive line LL is thereby connected to the ground line Ls, and the negative drive voltage MNOG is discharged. Therefore, the negative drive voltage MNOG is prevented from rising to the positive drive voltage MPOG or more, and as shown by the solid lines in FIGS. 8 and 9, the degree (voltage value) of an undershoot in the output waveform of the negative output amplifier is reduced.

As described above, the output units (33 and 43) of the positive and negative output amplifiers (25$_{(2x-1)}$ and 25$_{(2x)}$) according to the embodiment include clamp circuits (33 and 34), respectively, as the voltage regulation circuits regulating such that the positive drive voltage MPOG is higher than the negative drive voltage MNOG (in other words, the negative drive voltage MNOG is lower).

According to the configuration, it is possible to prevent an overshoot of the output voltage caused by an excessive reduction in the positive drive voltage MPOG in the positive output amplifier, and an undershoot of the output voltage caused by an excessive increase in the negative drive voltage MNOG in the negative output amplifier.

The present invention is not limited to the above-described embodiment. For example, the voltage values of the bias voltage VBL5, the bias voltage VBH6, the positive drive voltage MPOG, the negative drive voltage MNOG, the threshold voltage Vth, and the like are not limited to the values described in the aforementioned embodiment. The voltage values may be set at any values as long as, when the positive drive voltage MPOG is equal to or lower than the negative drive voltage MNOG (in other words, when the negative drive voltage MNOG is equal to or higher than the positive drive voltage MPOG), the transistors M30 and M40 are turned on.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2017-132765 filed on Jul. 6, 2017, the entire contents of which are incorporated herein by reference.

What is claimed is:

1. An output amplifier configured to amplify a gradation voltage supplied thereto, so as to generate an amplified gradation voltage, the output amplifier comprising:
    a differential unit configured to send a current corresponding to a voltage difference between said gradation voltage and said amplified gradation voltage to a first current line;
    a current mirror unit connected between a first voltage supply line to which a first voltage is supplied and a second voltage supply line to which a second voltage lower than said first voltage is supplied, the current mirror unit being configured to send a current to the second current line by an amount corresponding to an amount of the current flowing through the first current line; and
    an output unit including first and second drive lines that are respectively connected to said second current line, an output line through which said amplified gradation voltage is output, a first output transistor configured to send a current based on a voltage of said first drive line to said output line, and a second output transistor configured to send a current based on a voltage of said second drive line to said output line, wherein
    said output unit includes a switch device configured to directly connect said first voltage supply line to said first drive line to apply the first voltage to said first drive line when the voltage of said first drive line is equal to or lower than the voltage of said second drive line.

2. The output amplifier according to claim 1, wherein
    said first output transistor is a MOSFET of a first conductive type, and said first output transistor has a source that receives said first voltage, a drain connected to said output line, and a gate connected to said first drive line;
    said second output transistor is a MOSFET of a second conductive type that is opposite to said first conductive type, and said second output transistor has a source that receives a third voltage that is a voltage between said first voltage and said second voltage, a drain connected to said output line, and a gate connected to said second drive line; and said switch device is a MOSFET of said second conductive type, and said switch device has a clamp transistor that has a source connected to said first drive line, a drain connected to said first voltage supply line, and a gate that receives a voltage corresponding to a sum of a threshold voltage and the voltage of said second drive line.

3. A display driver comprising a plurality of output amplifiers configured to amplify gradation voltages supplied thereto, so as to generate amplified gradation voltages, wherein said plurality of output amplifiers are constituted of a first output amplifier group and a second output amplifier group, each of said output amplifiers belonging to said first output amplifier group and said second output amplifier group includes:

a differential unit configured to send a current corresponding to a voltage difference between said gradation voltage and said amplified gradation voltage to a first current line;

a current mirror unit connected between a first voltage supply line to which a first voltage is supplied and a second voltage supply line to which a second voltage lower than said first voltage is supplied, the current mirror unit being configured to send a current to the second current line by an amount corresponding to an amount of the current flowing through said first current line; and an output unit including first and second drive lines respectively connected to said second current line, an output line through which said amplified gradation voltage is output, a first output transistor configured to send a current based on a voltage of said first drive line to said output line, and a second output transistor configured to send a current based on a voltage of said second drive line to said output line, said output unit of each of said output amplifiers belonging to said first output amplifier group includes a first voltage regulation circuit configured to control the voltage of said first drive line such that the voltage of said first drive line is higher than the voltage of said second drive line, and said output unit of each of said output amplifiers belonging to said second output amplifier group includes a second voltage regulation circuit configured to control the voltage of said second drive line such that the voltage of said second drive line is lower than the voltage of said first drive line.

4. The display driver according to claim 3, wherein said first voltage regulation circuit is a first switching circuit configured to connect between said first voltage supply line and said first drive line in accordance with the voltage of said first drive line; and said second voltage regulation circuit is a second switching circuit configured to connect between said second voltage supply line and said second drive line in accordance with the voltage of said second drive line.

5. The display driver according to claim 4, wherein in each of said output amplifiers belonging to said first output amplifier group, said first output transistor is a MOSFET of a first conductive type, and said first output transistor has a source that receives said first voltage, a drain connected to said output line, and a gate connected to said first drive line;

said second output transistor is a MOSFET of a second conductive type that is opposite to said first conductive type, and said second output transistor has a source that receives a third voltage that is a voltage between said first voltage and said second voltage, a drain connected to said output line, and a gate connected to said second drive line; and said first switching circuit is a MOSFET of said second conductive type, and said first switching circuit has a first clamp transistor that has a source connected to said first drive line, a drain connected to said first voltage supply line, and a gate that receives a voltage corresponding to a sum of a threshold voltage and the voltage of said second drive line, and in each of said output amplifiers belonging to said second output amplifier group, said first output transistor is a MOSFET of said first conductive type, and said first output transistor has a source that receives said third voltage, a drain connected to said output line, and a gate connected to said first drive line;

said second output transistor is a MOSFET of said second conductive type, and said second output transistor has a source that receives said second voltage, a drain connected to said output line, and a gate connected to said second drive line; and said second switching circuit is a MOSFET of said first conductive type, and said second switching circuit has a second clamp transistor that has a source connected to said second drive line, a drain connected to said second voltage supply line, and a gate that receives a voltage corresponding to a difference between a threshold voltage and the voltage of said first drive line.

6. An output amplifier configured to amplify a gradation voltage supplied thereto, so as to generate an amplified gradation voltage, the output amplifier comprising:

a differential unit configured to send a current corresponding to a voltage difference between said gradation voltage and said amplified gradation voltage to a first current line;

a current mirror unit connected between a first voltage supply line to which a first voltage is supplied and a second voltage supply line to which a second voltage lower than said first voltage is supplied, the current mirror unit being configured to send a current to the second current line by an amount corresponding to an amount of the current flowing through the first current line; and an output unit including first and second drive lines that are respectively connected to said second current line, an output line through which said amplified gradation voltage is output, a first output transistor configured to send a current based on a voltage of said first drive line to said output line, and a second output transistor configured to send a current based on a voltage of said second drive line to said output line, wherein said output unit includes a switch device configured to directly connect said second voltage supply line to said second drive line to apply the second voltage to said second drive line when the voltage of said second drive line is equal to or higher than the voltage of said first drive line.

7. The output amplifier according to claim 6, wherein said first output transistor is a MOSFET of a first conductive type, and the first output transistor has a source that receives a third voltage that is a voltage between said first voltage and said second voltage, a drain connected to said output line, and a gate connected to said first drive line;

said second output transistor is a MOSFET of a second conductive type that is opposite to said first conductive type, and said second output transistor has a source that receives said second voltage, a drain connected to said output line, and a gate connected to said second drive line; and said switch device is a MOSFET of said first conductive type, and said switch device has a clamp transistor that has a source connected to said second drive line, a drain connected to said second voltage supply line, and a gate that receives a voltage corresponding to a difference between a threshold voltage and the voltage of said first drive line.

* * * * *